US012684698B2

(12) United States Patent
Chao et al.

(10) Patent No.: US 12,684,698 B2
(45) Date of Patent: Jul. 14, 2026

(54) METHOD FOR MANUFACTURING A MULTILAYER CIRCUIT BOARD

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Lan-Ting Chao, Shenzhen (CN); Yin-Ju Chen, New Taipei (TW); Zheng-Ting Jiao, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 218 days.

(21) Appl. No.: 18/200,785

(22) Filed: May 23, 2023

(65) Prior Publication Data
US 2023/0292446 A1     Sep. 14, 2023

Related U.S. Application Data

(63) Continuation-in-part of application No. PCT/CN2021/125048, filed on Oct. 20, 2021.

(51) Int. Cl.
*H01R 43/00*          (2006.01)
*H05K 1/185*          (2026.01)
(Continued)

(52) U.S. Cl.
CPC ............. *H05K 3/301* (2013.01); *H05K 1/185* (2013.01); *H05K 3/421* (2013.01); *H05K 3/429* (2013.01);
(Continued)

(58) Field of Classification Search
CPC ....... H01L 23/488; H01L 21/56; H05K 1/185; H05K 3/301; H05K 3/421; H05K 3/429;
(Continued)

(56) References Cited

U.S. PATENT DOCUMENTS

| | | | | |
|---|---|---|---|---|
| 7,279,771 | B2 * | 10/2007 | Sunohara ............. | H05K 1/0231 257/E23.079 |
| 9,024,203 | B2 * | 5/2015 | Lai ......................... | H05K 1/184 174/259 |
| 10,163,773 | B1 * | 12/2018 | Kapusta .................. | H01L 24/17 |

FOREIGN PATENT DOCUMENTS

| | | |
|---|---|---|
| CN | 101192586 A | 6/2008 |
| CN | 105023900 A | 11/2015 |

(Continued)

*Primary Examiner* — Paul D Kim
(74) *Attorney, Agent, or Firm* — ScienBiziP, P.C.

(57) ABSTRACT

A method for manufacturing a multilayer circuit board includes providing an inner circuit substrate defining a through hole, attaching a support plate to the inner circuit substrate to seal an opening of the through hole; placing an electronic module in the through hole; pressing a first substrate onto a surface of the inner circuit substrate; removing the support plate; pressing a second substrate onto another surface of the inner circuit substrate, the first substrate and the second substrate infilling the through hole and jointly encapsulating the electronic module; forming a first conductive wiring layer on a surface of the first substrate facing away from the first surface to obtain a first circuit substrate, and forming a second conductive wiring layer on a surface of the second substrate facing away from the second surface to obtain a second circuit substrate. A multilayer circuit board is also disclosed.

11 Claims, 7 Drawing Sheets

(51) Int. Cl.
   *H05K 3/30*          (2006.01)
   *H05K 3/42*          (2006.01)
   *H05K 3/46*          (2006.01)
(52) U.S. Cl.
   CPC ......... *H05K 3/4644* (2013.01); *H05K 3/4697*
         (2013.01); *H05K 2201/09036* (2013.01); *H05K*
               *2203/0165* (2013.01); *H05K 2203/1469*
                                       (2013.01)
(58) Field of Classification Search
   CPC .............. H05K 3/4644; H05K 3/4697; H05K
               2203/0165; H05K 2203/09036; H05K
                                       2203/1469
   See application file for complete search history.

(56)                 References Cited

FOREIGN PATENT DOCUMENTS

| CN | 108235562 A | 6/2018 |
| CN | 108987371 A | 12/2018 |
| CN | 112312656 A | 2/2021 |
| WO | 2015108393 A1 | 7/2015 |

* cited by examiner

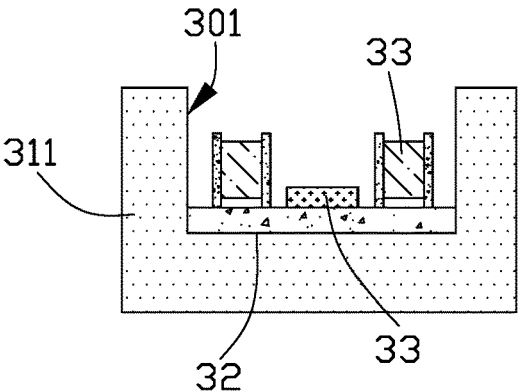
FIG. 7
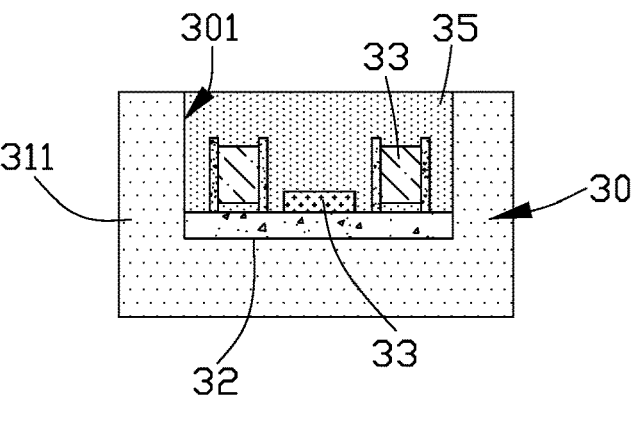
FIG. 8
FIG. 9

METHOD FOR MANUFACTURING A MULTILAYER CIRCUIT BOARD

FIELD

The subject matter herein generally relates to field of circuit board manufacture, in particular, to a multilayer circuit board with a module embedded therein and method for manufacturing the multilayer circuit board.

BACKGROUND

Electronic products usually include circuit boards and a volume of the electronic product must be large enough to contain the circuit board. Electronic components (such as resistors, capacitors, etc.) can be embedded in inside of the circuit board to reduce a thickness of the circuit board, thereby reducing a thickness of the electronic product. The electronic component is embedded by placing the electronic component in a cavity and then adding layers thereon. During the process of adding layers, the electronic component may deviate, making it more difficult to precisely align blind holes formed in subsequent processes and solder terminals of the electronic component.

BRIEF DESCRIPTION OF THE DRAWINGS

Implementations of the present technology will now be described, by way of embodiment, with reference to the attached figures.

FIG. 7 is a cross-sectional view showing a plurality of electronic components accommodated in the groove of FIG. 6.

FIG. 8 is a cross-sectional view showing glue infilled into the groove of FIG. 7.

FIG. 9 is a cross-sectional view of a plurality of electronic modules formed by separating the insulation plate of FIG. 8.

DETAILED DESCRIPTION

Figure 1:
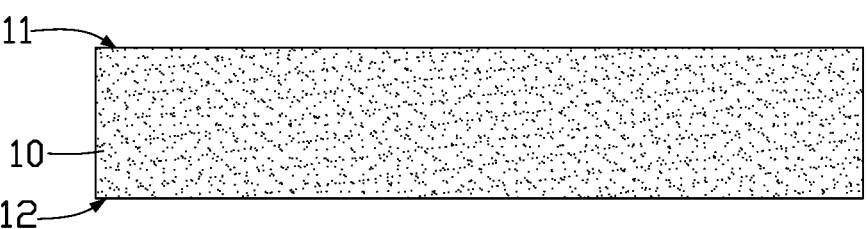
FIG. 1 is a cross-sectional view of an embodiment of an inner circuit substrate according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "connected" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIGS. 1 to 14, a method for manufacturing a multilayer circuit board 100 is illustrate. The method includes steps as follows.

Step S1, referring to FIG. 1, an inner circuit substrate 10 is provided. The inner circuit substrate 10 includes a first surface 11 and a second surface 12 opposite to the first surface 11.

The inner circuit substrate 10 is a circuit board with conductive wirings. The inner circuit substrate 10 includes at least one conductive wiring layer and at least one dielectric layer. If there are a plurality of conductive wiring layers and a plurality of dielectric layers, each dielectric layer is disposed between two adjacent conductive wiring layers and is provided with a conductive structure configured for electrically connecting the two adjacent conductive wiring layers.

The dielectric layer can be made of rigid an insulating material, such as FR-4 polyimide, polypropylene, liquid crystal polymer, polyetheretherketone, polyethylene terephthalate, or polyethylene naphthalate. The dielectric layer can also be made of flexible an insulating material, such as polyimide, polypropylene, liquid crystal polymer, polyetheretherketone, polyethylene terephthalate, polyethylene naphthalate, etc. The materials of the conductive wiring layer may include but are not limited to copper, gold, silver, etc.

The inner circuit substrate 10 can be manufactured by a conventional manufacturing method of a circuit board. For example, a core substrate is prepared, followed by adding layers on opposite sides of the core substrate to obtain the inner circuit substrate 10.

Figure 2:
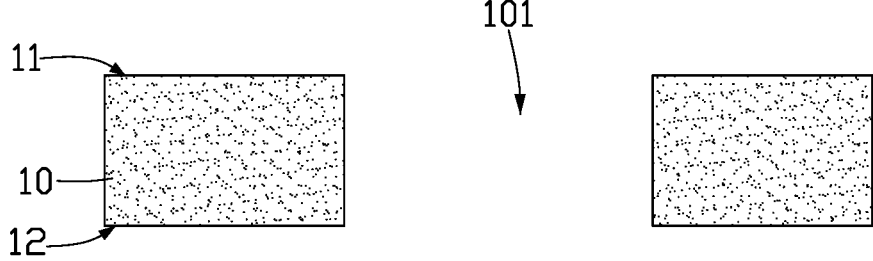
FIG. 2 is a cross-sectional view showing a through hole defined on the inner circuit substrate of FIG. 1.

Step S2, referring to FIG. 2, through hole 101 is formed in the inner circuit substrate 10.

The through hole 101 penetrates the first surface 11 and the second surface 12. The through hole 101 can be formed by mechanical drilling or laser drilling.

Figure 3:
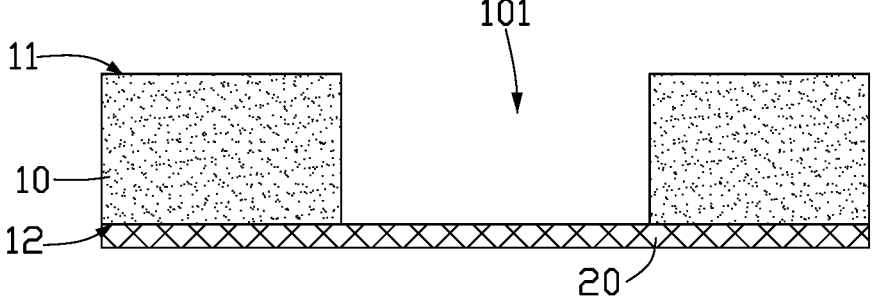
FIG. 3 is a cross-sectional view showing a support plate attached to a surface of the inner circuit substrate of FIG. 2.

Step S3, referring to FIG. 3, a support plate 20 is attached to the second surface 12 to cover and seal an opening of through hole 101.

An adhesive layer may be sandwiched between the support plate 20 and the inner circuit substrate 10 for adhering a component to be embedded. In one embodiment, the support plate 20 is an adhesive tape, the adhesive tape is adhered to the second surface 12 of the inner circuit substrate 10 and covers and seals the opening of the through hole 101.

Figure 4:
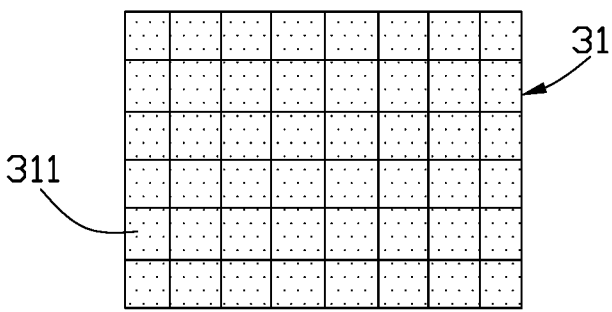
FIG. 4 is a top view of an embodiment of an insulation plate according to the present disclosure.
Figure 5:
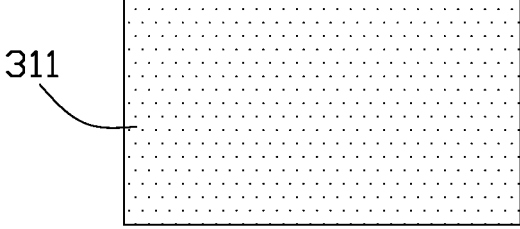
FIG. 5 is a cross-sectional view of a main body of the insulation plate of FIG. 4.

Step S4, referring to FIG. 4 and FIG. 5, an insulation plate 31 is provided. The insulation plate 31 includes a plurality of main bodies 311 which are arranged in a matrix. The plurality of main bodies 311 are interconnected to form the insulation plate 31.

The main bodies 311 can be made of materials which are heat resistant pressure sensitive and can be melt by laser. The materials can be, but are not limited to, dielectric materials, such as polyimide, epoxy resin, etc.

Figure 6:
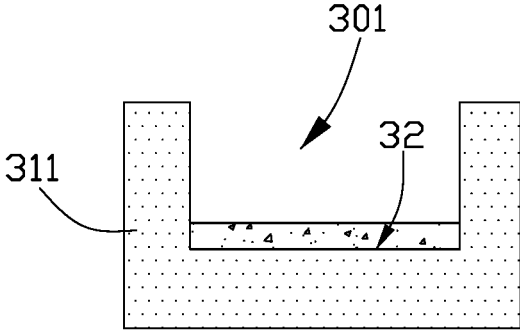
FIG. 6 is a cross-sectional view showing a groove defined on the main body of FIG. 5.

Referring to FIG. 6, a groove 301 is defined on each of the main bodies 311, and a first adhesive layer 32 is applied to a bottom of groove 301.

The groove 301 penetrates one surface of the main body 311. The groove 301 can be formed by mechanical drilling or laser drilling.

The first adhesive layer 32 can be applied to a bottom wall of the groove by printing, coating, or dispensing. In one embodiment, the first adhesive layer 32 covers the entire bottom wall of the groove 301.

Step S6, referring to FIG. 7, at least one electronic component 33 is mounted on the first adhesive layer 32 in the groove 301.

The electronic component 33 is placed onto the first adhesive layer 301, the first adhesive layer 301 is adhered to the electronic component 33, so that the electronic component 33 is positioned in the groove 301. The at least one electronic component 33 can include at least one of active components and passive components. In one embodiment, one active component and two passive components are accommodated in one groove 301. It can be understood that the number of active components and passive components accommodated in the groove 301 can be adjusted according to actual needs.

Step S7, referring to FIG. 8, glue is infilled into the groove 301 to form a second adhesive layer 35, obtaining an electronic module 30.

The second adhesive layer 35 covers surfaces of the electronic components 33 exposed from the first adhesive layer 32 and is connected to the first adhesive layer 32. The second adhesive layer 35 and the first adhesive layer 32 cooperatively encapsulate the electronic components 33, so that the electronic components 33 are embedded in the adhesive layer composed of the second adhesive layer 35 and the first adhesive layer 32.

A surface of the second adhesive layer 35 exposed from the groove 301 is flush with a surface of the main body 311 defining the groove 301, so that the second adhesive layer 35 and the main body 311 have level surfaces without level difference therebetween.

When the glue is infilled into the groove 301 to form the second adhesive layer 35, since the electronic components 33 have been fixed in the groove 301 through the first adhesive layer 32, the risk of deviation of the electronic components 33 caused by glue flowing can be reduced.

The materials of the first adhesive layer 32 and the second adhesive layer 35 can be, but are not limited to, an adhesive which can cure at room temperature.

Step S8, referring to FIG. 9, the plurality of electronic modules 30 are separated from each other along each boundary between each two main bodies 311. The plurality of electronic modules 30 can be separated from each other by mechanical cutting or laser cutting.

Figure 10:
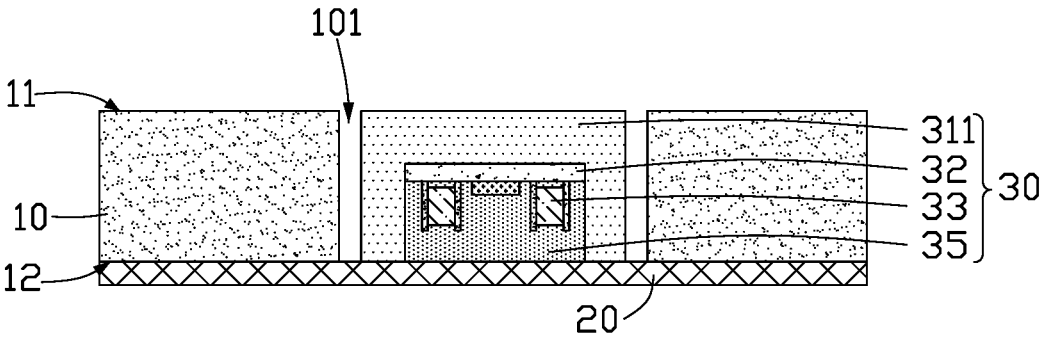
FIG. 10 is a cross-sectional view showing the electronic module of FIG. 8 placed in the through hole of FIG. 3.

Step S9, referring to FIG. 10, the electronic module 30 is placed in the through hole 101.

The electronic module 30 is supported by the support plate 20 and bonded to the support plate 20, so that the electronic module 30 is fixed in the through hole 101.

In one embodiment, the electronic module 30 is overturned and then placed in the through hole 101, so that the adhesive layer of the electronic module 30 is bonded to the support plate 20, the bonding strength between the electronic module 30 and the support plate 20 is improved.

In one embodiment, a height of the electronic module 30 is equal to a depth of the through hole 101.

Figure 11:
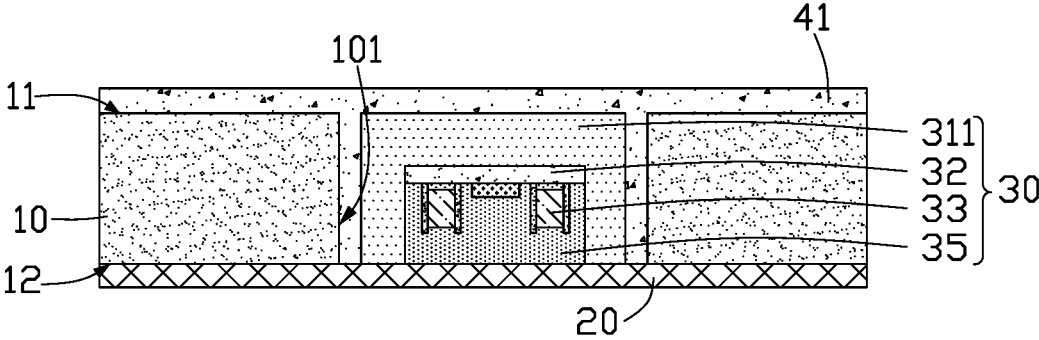
FIG. 11 is a cross-sectional view showing a first substrate pressed onto a side of the inner substrate facing away from the support plate of FIG. 10.

Step S10, referring to FIG. 11, a first substrate 41 is pressed onto the first surface 11 of the inner circuit substrate 10.

The first substrate 41 covers the first surface 11 of the inner circuit substrate 10 and exposed surface of the electronic module 30 and infills a gap between the electronic module 30 and the hole wall of the through hole 101.

The first substrate 41 can be made of dielectric materials, such as polyimide, epoxy resin, etc.

Figure 12:
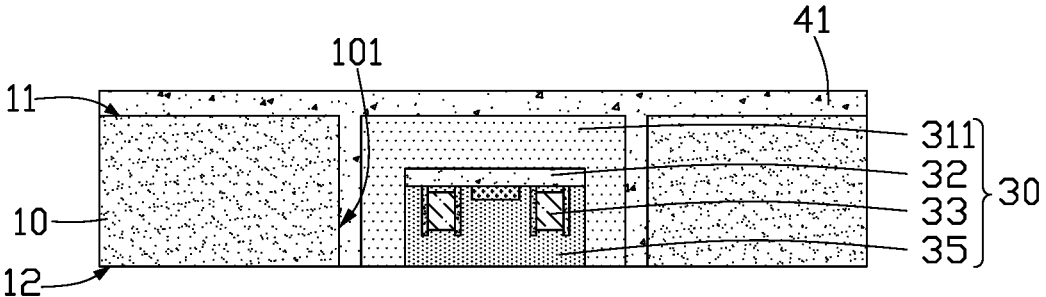
FIG. 12 is a cross-sectional view of a state in which the support plate of FIG. 11 is removed.

Step S11, referring to FIG. 12, the support plate 20 is removed to expose the second surface 12 of the inner circuit substrate 10. The support plate 20 can be removed by peeling.

Figure 13:
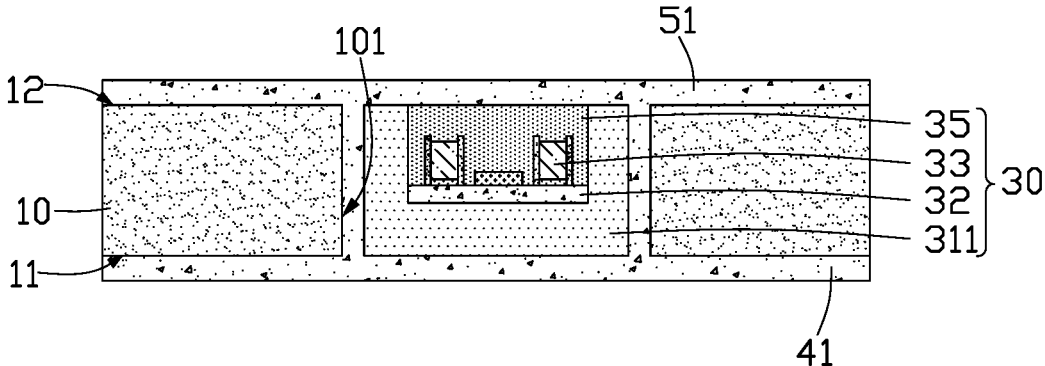
FIG. 13 is a cross-sectional view showing a second substrate pressed onto a side of the inner circuit substrate facing away from the first substrate of FIG. 12.
Figure 14:
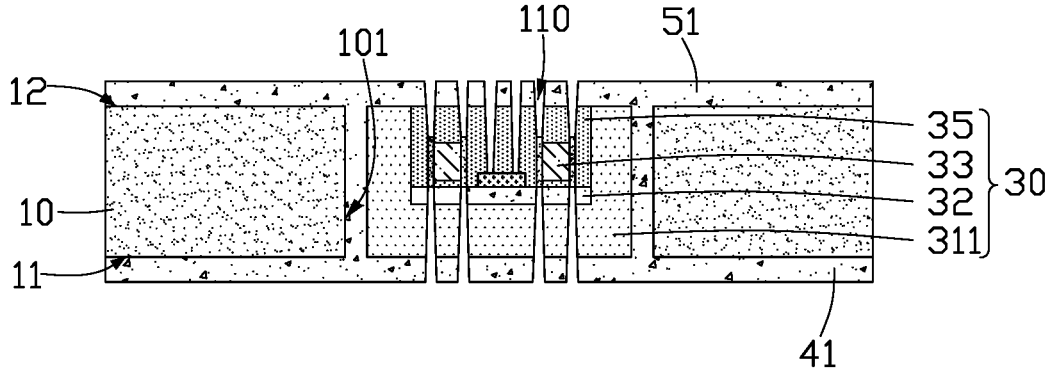
FIG. 14 is a cross-sectional view showing blind holes formed on the structure shown in FIG. 13.

Step S12, referring to FIG. 13, a second substrate 51 is pressed onto the second surface 12 of the inner circuit substrate 10.

The second substrate 51 covers the second surface 12 of the inner circuit substrate 10 and a surface of the electronic module 30 exposed from the first substrate 41 and is connected to the first substrate 41. The first substrate 41 and the second substrate 51 cooperatively encapsulate the electronic module 30, so that the electronic module 30 is embedded in the substrate composed of the first substrate composed of the first substrate 41 and the second substrate 51.

The second substrate 51 can be made of dielectric materials, such as polyimide, epoxy resin, etc.

Step S13, referring to FIG. 4, a plurality of blind holes 110 exposing the solder terminals of the electronic components 33 are formed.

The position and quantity of the blind hole 110 can be changed according to the type, quantity of the electronic component 33. In one embodiment, a plurality of blind holes 110 corresponding to a plurality of electronic components 33 are formed, a portion of the blind holes 110 penetrates the second substrate 51 and the second adhesive layer 35, and another portion of the blind holes 110 penetrates the first substrate 41, the main body 311, and the first adhesive layer 32.

The blind holes 110 can be formed by mechanical drilling or laser drilling.

Figure 15:
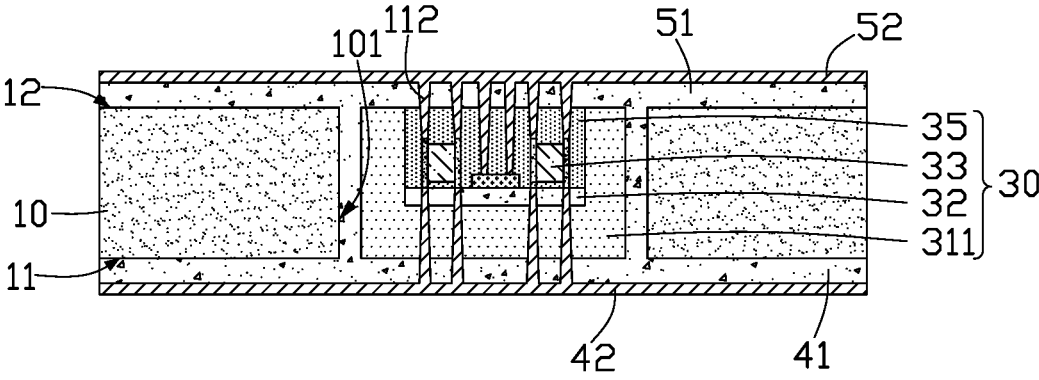
FIG. 15 is a cross-sectional view showing a first conductive structure formed in the blind holes of FIG. 14.

Step S14, referring to FIG. 15, a first metal layer 42 and a second metal layer 52 are formed on a surface of the first substrate 41 facing away from the first surface 11 and a surface of the second substrate 51 facing away from the second surface 12 respectively, and first conductive structures 112 are formed in the blind holes 110.

The first metal layer 42 covers the entire surface of the first substrate 41 facing away from the first surface 11 of the inner circuit substrate 10. The second metal layer 52 covers the entire surface of the second substrate 51 facing away from the second surface 12 of the inner circuit substrate 10. The first metal layer 42 and the second metal layer 52 are electrically connected to solder terminals of corresponding electronic components 33 through first conductive structures 112 respectively. The first conductive structures 112 can be conductive holes or conductive pillars.

The first metal layer 42, the second metal layer 52, and the first conductive structures 112 can be formed by electroplating or printing. In one embodiment, the first metal layer 42, the second metal layer 52, and the first conductive structures 112 are formed by electroplating, and the first conductive structures 112 are conductive holes.

Figure 16:
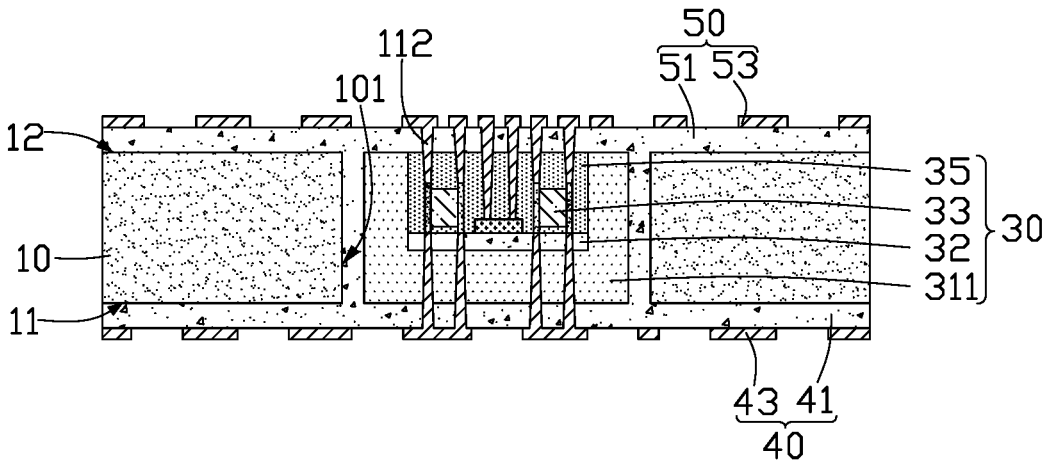
FIG. 16 is a cross-sectional view showing a first conductive wiring layer and a second conductive wiring layer respectively formed from the first substrate of FIG. 15 and the second substrate of FIG. 15.

Step S15, referring to FIG. 16, a first conductive wiring layer 43 and a second conductive wiring layer 53 are respectively formed from the first metal layer and the second metal layer. In one embodiment, the first metal layer and the second metal layer are etched to form the first conductive wiring layer 43 and the second conductive wiring layer 53.

The first conductive wiring layer 43 and the first substrate 41 jointly constitute a first circuit substrate 40. The second conductive wiring layer 53 and the second substrate 51 jointly constitute a second circuit substrate 50. The first conductive wiring layer 43 and the second conductive wiring layer 53 are electrically connected to corresponding electronic components 33 through the first conductive structures 112.

Figure 17:
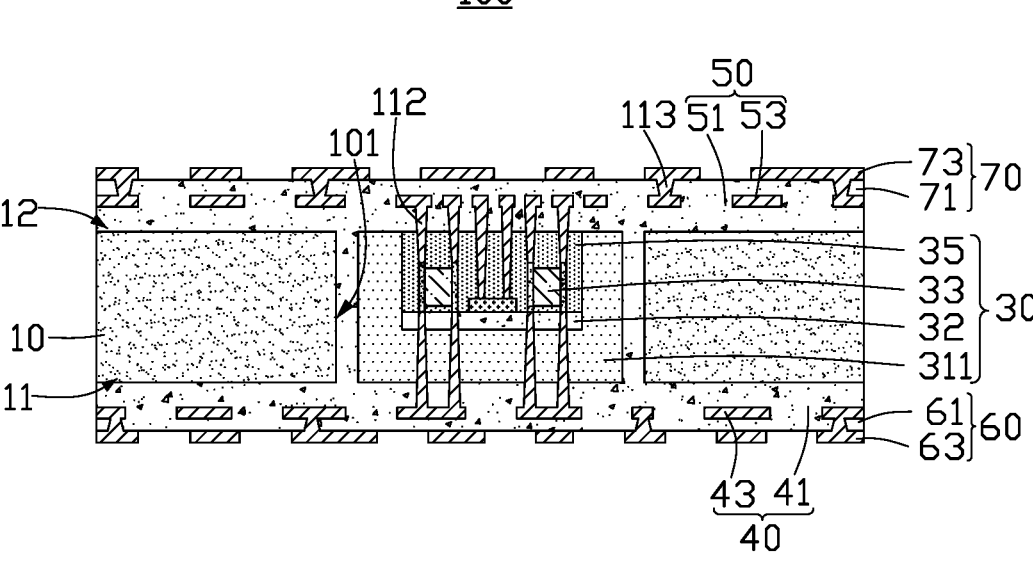
FIG. 17 is a cross-sectional view showing a third circuit substrate and a fourth circuit substrate respectively formed on the first conductive wiring layer of FIG. 16 and the second conductive wiring layer of FIG. 16.

Step S16, referring to FIG. 17, a third circuit substrate 60 and a fourth circuit substrate 70 are formed on surfaces of the first conductive wiring layer 43 and the second conductive wiring layer 53 respectively, obtaining the multilayer circuit board 100.

The third circuit substrate 60 includes a third substrate 61 and a third conductive wiring layer 63 laminated on the third substrate 61. The third substrate 61 covers the first conductive wiring layer 43 and infills gaps between wirings of the first conductive wiring layer 43 to connect the first substrate 41. The third conductive wiring layer 63 is on a surface of the third substrate 61 facing away from the first conductive wiring layer 43.

The fourth circuit substrate 70 includes a fourth substrate 71 and a fourth conductive wiring layer 73 laminated on the fourth substrate 71. The fourth substrate 71 covers the second conductive wiring layer 53 and infills gaps between wirings of the second conductive wiring layer 53 to connect the second substrate 51. The fourth conductive wiring layer 73 is on a surface of the fourth substrate 71 facing away from the second conductive wiring layer 53.

The third substrate 61 and the fourth substrate 71 can be made of dielectric materials, such as polyimide, epoxy resin, etc.

The multilayer circuit board 100 further includes a plurality of second conductive structures 113. A portion of the second conductive structures 113 electrically connects the first conductive wiring layer 43 and the third conductive wiring layer 63, and another portion of the second conductive structures 113 electrically connects the second conductive wiring layer 53 and the fourth conductive wiring layer 73. The second conductive structures 113 can be conductive holes or conductive pillars.

Referring to FIG. 17, the multilayer circuit board 100 is illustrated. The multilayer circuit board 100 includes the inner circuit substrate 10, the electronic module 30, the first circuit substrate 40, the second circuit substrate 50, the third circuit substrate 60, and the fourth circuit substrate 70.

The inner circuit substrate 10 includes the first surface 11 and the second surface 12 opposite to the first surface 11 and defines the through hole 101 penetrating the first surface 11 and the second surface 12. The electronic module 30 is accommodated in the through hole 101. The first circuit substrate 40 includes the first substrate 41 and the first conductive wiring layer 43 laminated on the first substrate 41. The second circuit substrate 50 includes the second substrate 51 and the second conductive wiring layer 53 laminated on the second substrate 51. The first substrate 41 covers the first surface 11, the second substrate 51 covers the second surface 13, and the first substrate 41 and the second substrate 51 infill the through hole 101, so that the first substrate 41 and the second substrate 51 cooperatively encapsulate the electronic module 30.

The electronic module 30 includes the main body 311, at least one electronic component 33, the first adhesive layer 32, and the second adhesive layer 35. The main body 311 defines the groove 301, the electronic component 33 is fixed in the bottom wall of the groove 301 through the first adhesive layer 32. The second adhesive layer 35 infills the groove 301, the second adhesive layer 32 and the first adhesive layer 32 cooperatively encapsulate the electronic component 33.

In the multilayer circuit board 100 and the manufacturing method, the electronic module 30 is bonded to and positioned on the support plate 20 in advance, reducing the risk of deviation caused by the flow of dielectric materials in the subsequent pressing process of the substrate. The electronic component 33 is fixed in the groove 301 through the first adhesive layer 32 in advance, further reducing the risk of deviation caused by flowing adhesive in subsequent filling processes. In addition, the plurality of electronic components 33 are integrated into the electronic module 30, so that the manufacturing processes are simplified.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a multilayer circuit board, comprising:

providing an inner circuit substrate, wherein the inner circuit substrate is provided with a first surface and a second surface opposite to the first surface;

forming a through hole penetrating the first surface and the second surface;

attaching a support plate to the second surface to seal an opening of the through hole;

providing an electronic module, wherein the electronic module is provided with a main body, at least one electronic component, a first adhesive layer, and a second adhesive layer, the main body defining a groove, the at least one electronic component is fixed to a bottom wall of the groove through the first adhesive layer, the second adhesive layer infilling the groove, and the first adhesive layer and the second adhesive layer jointly encapsulates the at least one electronic component;

placing the electronic module in the through hole, wherein the electronic module is bonded to the support plate;

pressing a first substrate onto the first surface;

removing the support plate;

pressing a second substrate onto the second surface, the first substrate and the second substrate infilling the through hole and jointly encapsulating the electronic module; and forming a first conductive wiring layer on a surface of the first substrate facing away from the first surface to obtain a first circuit substrate, and forming a second conductive wiring layer on a surface of the second substrate facing away from the second surface to obtain a second circuit substrate; wherein a surface of the second adhesive layer exposed from the groove is flush with a surface of the main body having the groove.

2. The method of claim 1, wherein providing the electronic module further comprises:

providing the main body;

forming the groove on the main body;

forming the first adhesive on the bottom wall of the groove;

mounting the at least one electronic component on the first adhesive layer; and infilling a glue in the groove to form the second adhesive layer.

3. The method of claim 1, wherein when the electronic module is placed in the through hole, the second adhesive layer is boned to the support plate.

4. The method of claim 1, wherein a height of the electronic module is equal to a height of the through hole.

5. The method of claim 1, further comprising:

forming a third circuit substrate on a surface of the first conductive wiring layer; and forming a fourth circuit substrate on a surface of the second conductive wiring layer.

6. The method of claim 5, wherein the third circuit substrate is provided with a third substrate and a third conductive wiring layer laminated on the third substrate, the third substrate covers the first conductive wiring layer and is connected to the first substrate; the fourth circuit substrate is provided with a fourth substate and a fourth conductive wiring layer laminated on the fourth substrate, the fourth substrate covers the second conductive wiring layer and is connected to the second substate.

7. The method of claim 6, further comprising:

forming a plurality of conductive structures, a portion of the plurality of conductive structures electrically connecting the second conductive wiring layer and the fourth conductive wiring layer, and another portion of the plurality of conductive structures electrically connecting the first conductive wiring layer and the third conductive wiring layer.

8. The method of claim 1, wherein forming the first conductive wiring layer on the surface of the first substrate facing away from the first surface to obtain the first circuit substrate further comprises:

forming a metal layer on the surface of the first substrate facing away from the first surface; and forming the first conductive wiring layer from the metal layer to obtain the first circuit substrate.

9. The method of claim 1, wherein forming the second conductive wiring layer on the surface of the second substrate facing away from the second surface to obtain the second circuit substrate further comprises:

forming a metal layer on the surface of the second substrate facing away from the second surface; and forming the second conductive wiring layer from the metal layer to obtain the second circuit substrate.

10. The method of claim 1, further comprising:

forming a blind hole penetrating the second substrate and the second adhesive layer to expose a portion of the at least one electronic component;

forming a first conductive structure in the blind hole, the first conductive structure electrically connecting the at least one electronic component and the second conductive wiring layer.

11. The method of claim 1, further comprising:

forming a blind hole penetrating the first substrate, the main body, and the first adhesive layer to expose a portion of the at least one electronic component;

forming a first conductive structure in the blind hole, the first conductive structure electrically connecting the at least one electronic component and the first conductive wiring layer.

* * * * *